(12) United States Patent
Lai

(10) Patent No.: US 6,446,708 B1
(45) Date of Patent: Sep. 10, 2002

(54) HEAT DISSIPATING DEVICE

(75) Inventor: Yaw-Huey Lai, Hsi-Chih (TW)

(73) Assignee: TAI-SOL Electronics Co., Ltd., Hsi-Chih (TW)

( * ) Notice: Subject to any disclaimer, the term of this patent is extended or adjusted under 35 U.S.C. 154(b) by 0 days.

(21) Appl. No.: 09/978,195

(22) Filed: Oct. 17, 2001

(51) Int. Cl.[7] .............................................. H05K 7/20
(52) U.S. Cl. ...................... 165/80.3; 165/185; 361/704; 257/719
(58) Field of Search ................................ 165/80.3, 185; 361/697, 704, 710; 174/16.3; 257/719, 722

(56) References Cited

U.S. PATENT DOCUMENTS

| | | | | | |
|---|---|---|---|---|---|
| 3,303,392 A | * | 2/1967 | Zelina | ........................ | 165/80.3 |
| 3,541,433 A | * | 11/1970 | Davis | ........................ | 257/722 |
| 3,566,958 A | * | 3/1971 | Zelina | ........................ | 165/185 |
| 4,557,225 A | * | 12/1985 | Sagues et al. | ........... | 123/41.31 |
| 5,486,980 A | * | 1/1996 | Jordan et al. | ............... | 165/121 |
| 5,574,626 A | * | 11/1996 | Smith | ........................ | 165/185 |
| 5,927,386 A | * | 7/1999 | Lin | ............................ | 165/121 |
| 6,138,488 A | * | 10/2000 | Lee | ............................. | 72/254 |

* cited by examiner

*Primary Examiner*—Allen Flanigan
(74) *Attorney, Agent, or Firm*—Baker Botts L.L.P.

(57) ABSTRACT

A heat dissipating device includes a base unit adapted to contact and to be in thermal communication with a heat-generating source. A plurality of parallel heat-dissipating fin units are provided on the base unit, each of which is spaced apart from each other and includes a mounting portion connected integrally to the base unit, two extensions extending respectively and integrally from opposite sides of the mounting portion, and a plurality of elongated parallel fin plates extending from an upper end of the mounting portion and from upper and lower ends of the extensions along a direction that is perpendicular to a bottom surface of the base unit.

3 Claims, 3 Drawing Sheets

HEAT DISSIPATING DEVICE

BACKGROUND OF THE INVENTION

1. Field of the Invention

The invention relates to a heat dissipating device, more particularly to a heat dissipating device that can improve heat-dissipating efficiency.

2. Description of the Related Art

With the increase in the functions of the microprocessor, the microprocessor is likely to generate large amounts of heat during operation thereof. To prevent overheating which may result in undesirable shutdown of the microprocessor, a heat sink is generally disposed on the microprocessor to help dissipate the heat generated thereby. A fan can also be disposed on the heat sink for cooling the same.

FIG. 1 illustrates a conventional heat dissipating device that includes a base plate 10, and rows of parallel heat-dissipating posts 11 mounted on the base plate 10. Generally, the number of the posts 11 is limited by the size of the base plate 10. Further, referring to FIG. 2, any two adjacent rows of the posts 11 define an air path 12, within which air is prevented by the base plate 10 from flowing therethrough in a direction perpendicular to the base plate 10. When a fan (not shown) is disposed on the conventional heat dissipating device for blowing air toward the posts 11, air convection around the posts 11 is reduced, thereby resulting in a poor heat-dissipating efficiency.

SUMMARY OF THE INVENTION

Therefore, the object of the present invention is to provide a heat dissipating device that can enhance air convection so as to improve the heat-dissipating efficiency.

According to the present invention, a heat dissipating device comprises:

- a base unit having a top surface, and a bottom surface adapted to contact and to be in thermal communication with a heat-generating source; and
- a plurality of parallel heat-dissipating fin units provided on the top surface of the base unit, each of the fin units being spaced apart from each other along a first direction, and including
  - a mounting portion having a lower end connected integrally to the top surface of the base unit, an upper end, and two opposite sides,
  - two extensions extending respectively and integrally from the sides of the mounting portion along a second direction transverse to the first direction, each of the extensions having upper and lower ends, and
  - a plurality of elongated parallel fin plates extending from the upper end of the mounting portion and from the upper and lower ends of the extensions along a third direction that is perpendicular to the bottom surface of the base unit, and the first and second directions.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Referring to FIGS. 3 to 6, according to the preferred embodiment of this invention, a unitary heat dissipating device is shown to include a base unit 30, and a plurality of parallel heat-dissipating fin units 31.

Figure 1:
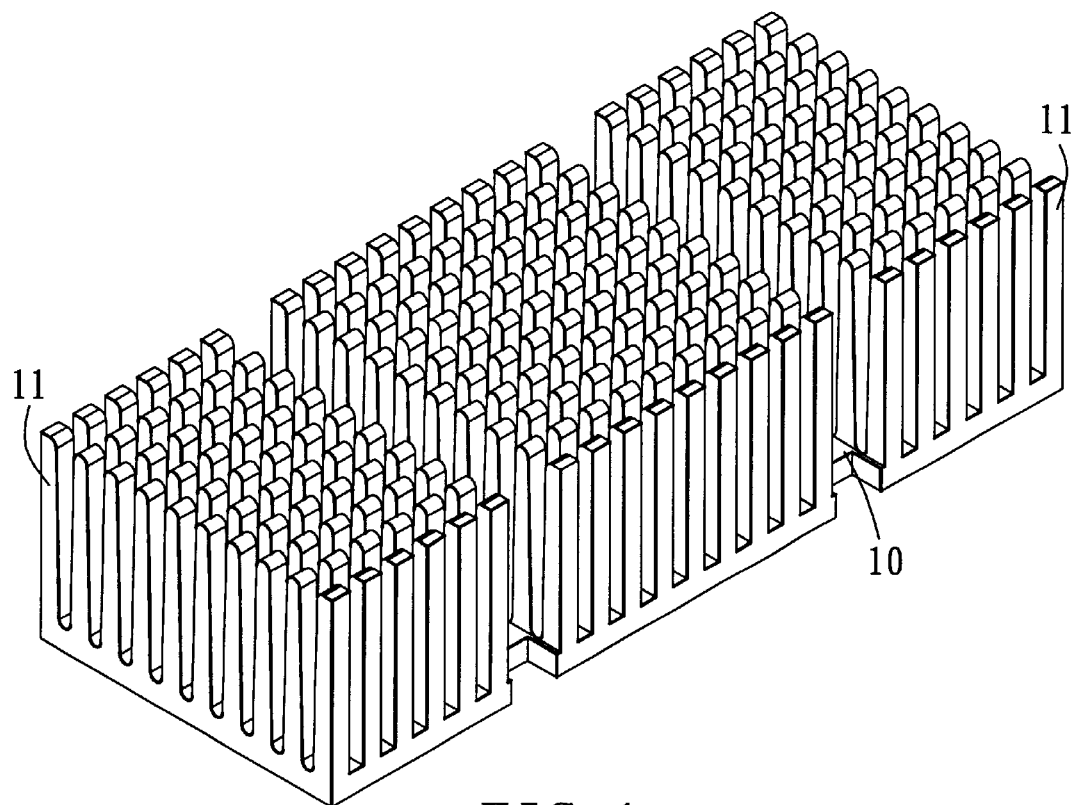
FIG. 1 is a perspective view of a conventional heat dissipating device.
Figure 2:
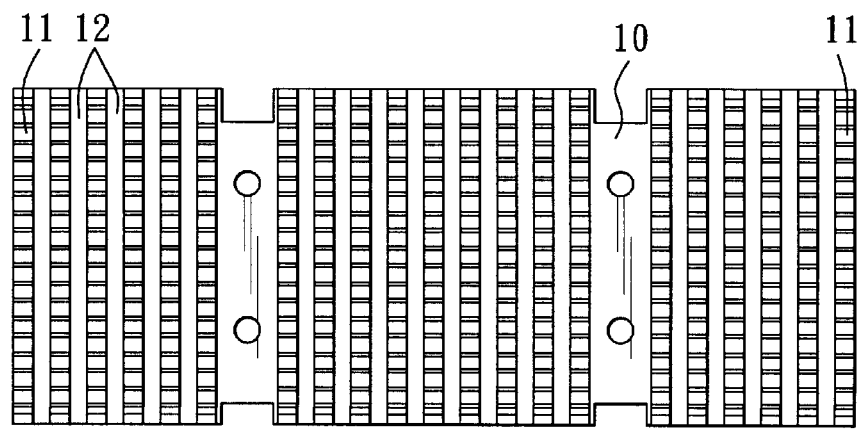
FIG. 2 is a schematic top view of the conventional heat dissipating device.
Figure 3:
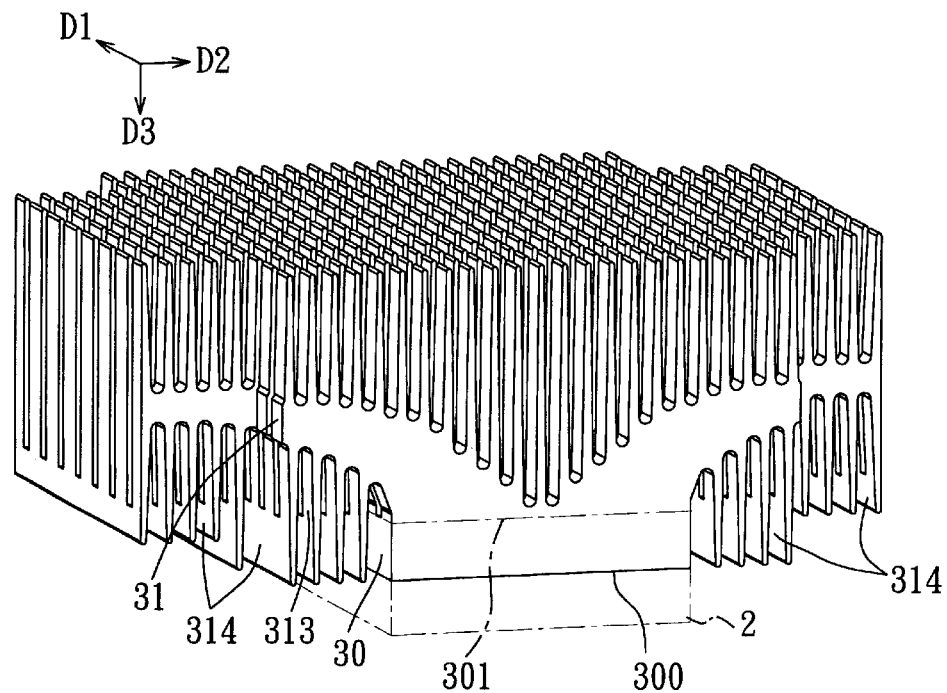
FIG. 3 is a perspective view showing the preferred embodiment of a heat dissipating device according to this invention.
Figure 4:
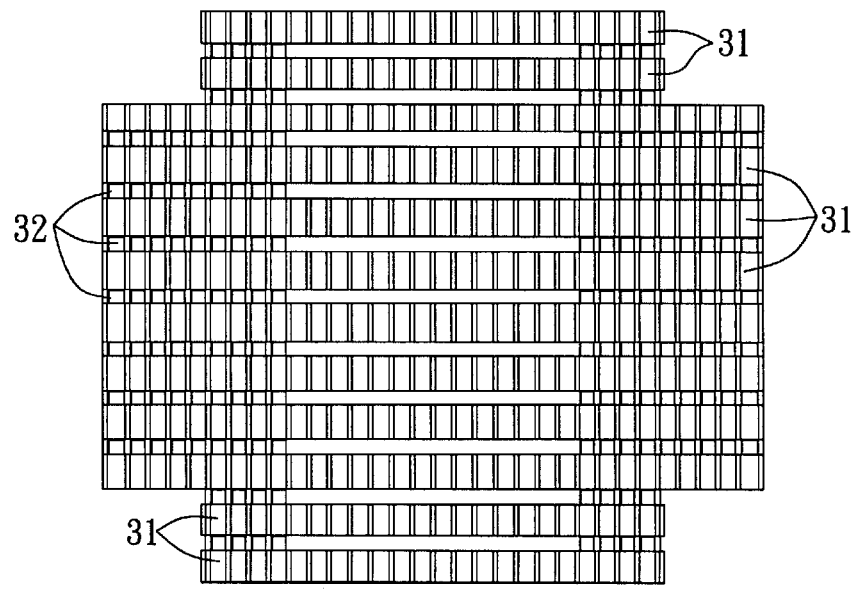
FIG. 4 is a schematic top view showing the preferred embodiment.
Figure 5:
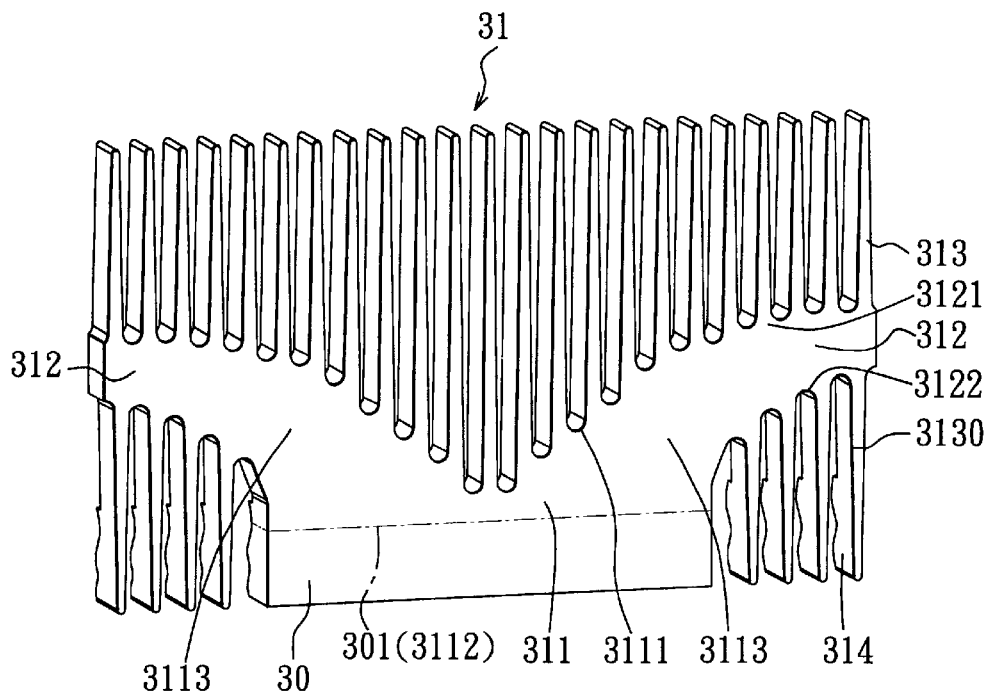
FIG. 5 is a perspective view showing a heat-dissipating fin unit of the preferred embodiment.

The base unit 30 has a top surface 301, shown in phantom lines in FIGS. 3 and 5, and a bottom surface 300 adapted to contact and to be in thermal communication with a heat-generating source 2, such as a microprocessor.

The fin units 31 are provided on the top surface 301 of the base unit 30, and are spaced apart from one another along a first direction (D1). Each fin unit 31 includes a mounting portion 311, two opposite extensions 312, and a plurality of elongated parallel fin plates 313, as shown in FIG. 5. The mounting portion 311 has an upper end 3111, a lower end 3112 connected integrally to the top surface 301 of the base unit 30, and two opposite sides 3113. The extensions 312 extend respectively and integrally from the sides 3113 of the mounting portion 311 along a second direction (D2) transverse to the first direction (D1).

Figure 6:
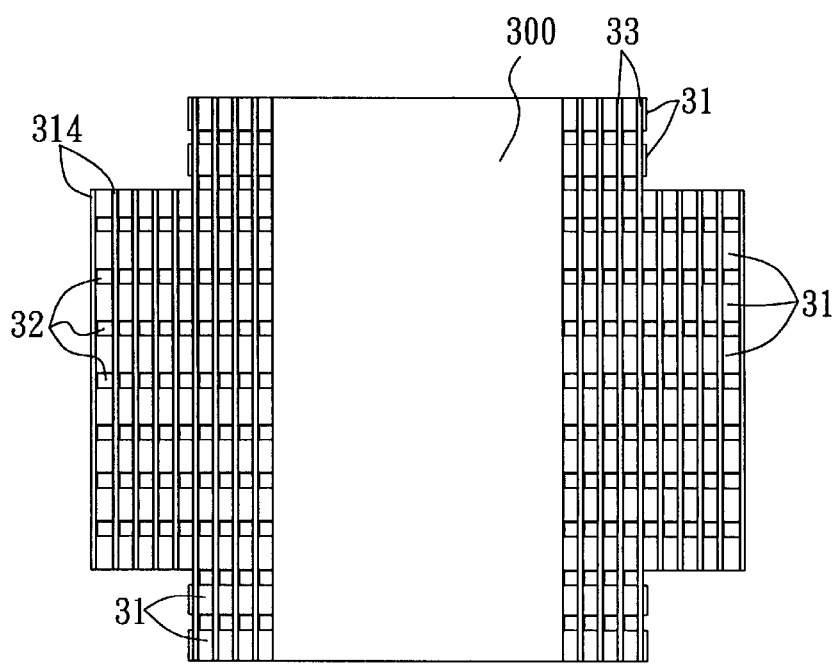
FIG. 6 is a schematic bottom view showing the preferred embodiment.

Each of the extensions 312 has upper and lower ends 3121, 3122. The fin plates 313 extend from the upper end 3111 of the mounting portion 311 and from the upper and lower ends 3121, 3122 of the extensions 312 along a third direction (D3) that is perpendicular to the bottom surface 300 of the base unit 30, and the first and second directions (D1, D2). Each adjacent pair of the fin plates 313 is spaced apart from each other along the second direction (D2). Each of the fin plates 313, that extend from the lower ends 3122 of the extensions 312, has a connecting end 3130. In this embodiment, the heat dissipating device further includes a plurality of parallel strips 314, which extend in the first direction (D1) and which are spaced apart from one another along the second direction (D2). Each of the strips 314 is connected integrally to the connecting end 3130 of a respective one of the fin plates 313, that extend from the lower ends 3122 of the extensions 312, of each fin unit 31, as shown in FIGS. 5 and 6. The assembly of the mounting portion 311 and the extensions 312 of each fin unit 31 is shaped as a dovetail. In actual practice, the extensions 312 can also be designed to have any other suitable shape for improving heat dissipation.

Due to the design of the extensions 312, the heat dissipating device of this invention can have numerous fin plates 313 so as to increase the heat-dissipating area. Furthermore, due to the presence of a spacing 32, which serves as an air path between each adjacent pair of the fin units 31, when a fan (not shown) is used for blowing air toward the fin units 31, heat accumulated in the fin units 31 can be carried away via the spacings 32 so as to enhance air convection, thereby resulting in an improved heat-dissipating efficiency. The object of the invention is thus met.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A heat dissipating device comprising:
   a base unit having a top surface, and a bottom surface adapted to contact and to be in thermal communication with a heat-generating source; and
   a plurality of parallel heat-dissipating fin units formed integrally with said top surface of said base unit, each of said fin units being spaced apart from each other along a first direction, and including
      a mounting portion having a lower end connected integrally to said top surface of said base unit, an upper end, and two opposite sides,
      two extensions extending respectively and integrally from said sides of said mounting portion along a second direction transverse to the first direction, each of said extensions having upper and lower ends, and
      a plurality of elongated parallel fin plates extending from said upper end of said mounting portion and from said upper and lower ends of said extensions along a third direction that is perpendicular to said bottom surface of said base unit, and the first and second directions.

2. The heat dissipating device as claimed in claim 1, wherein the assembly of said mounting portion and said extensions of each of said fin units is shaped as a dovetail.

3. The heat dissipating device as claimed in claim 1, wherein each of said fin plates, that extend from said lower ends of said extensions, has a connecting end,
   said heat dissipating device further comprising a plurality of parallel strips, which extend in the first direction and which are spaced apart from one another along the second direction,
   each of said strips being connected integrally to said connecting end of a respective one of said fin plates, that extend from said lower ends of said extensions, of each of said fin units.

* * * * *